US008780579B2

(12) United States Patent
Kwon et al.

(10) Patent No.: US 8,780,579 B2
(45) Date of Patent: Jul. 15, 2014

(54) ORGANIC LIGHT EMITTING DIODE DISPLAY

(75) Inventors: Oh-June Kwon, Yongin (KR);
Kuen-Dong Ha, Yongin (KR);
Hyun-Min Hwang, Yongin (KR); Ji-Ho Kang, Yongin (KR); Chan-Kyoung Moon, Yongin (KR); Hyun-Hee Lee, Yongin (KR); Jung-Jun Im, Yongin (KR); Dong-Su Yee, Yongin (KR);
In-Soo Lee, Yongin (KR); Min-Su Kim, Yongin (KR); Young-Cheol Joo, Yongin (KR); Seung-Yong Song, Yongin (KR);
Ji-Hun Ryu, Yongin (KR); Kwan-Hee Lee, Yongin (KR); Young-Seo Choi, Yongin (KR); Sun-Young Jung, Yongin (KR); Sun-Hwa Kim, Yongin (KR);
Dai-Han Cho, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 197 days.

(21) Appl. No.: 13/332,033

(22) Filed: Dec. 20, 2011

(65) Prior Publication Data

US 2012/0170244 A1 Jul. 5, 2012

(30) Foreign Application Priority Data

Jan. 5, 2011 (KR) .................. 10-2011-0000994
Jan. 5, 2011 (KR) .................. 10-2011-0001002

(51) Int. Cl.
*H05K 1/11* (2006.01)
*H05K 1/14* (2006.01)

(52) U.S. Cl.
USPC .......................................................... 361/784

(58) Field of Classification Search
None
See application file for complete search history.

(56) References Cited

U.S. PATENT DOCUMENTS

| 7,821,197 | B2* | 10/2010 | Lee ................................. | 313/504 |
|---|---|---|---|---|
| 7,825,594 | B2* | 11/2010 | Lee et al. ........................ | 313/512 |
| 2005/0057717 | A1* | 3/2005 | Rho ............................... | 349/158 |
| 2006/0227981 | A1* | 10/2006 | Miyata .......................... | 381/124 |
| 2006/0285043 | A1* | 12/2006 | Kim et al. ...................... | 349/122 |
| 2007/0053144 | A1* | 3/2007 | Nakatani et al. ............... | 361/680 |
| 2007/0109391 | A1* | 5/2007 | Noh et al. ...................... | 347/172 |
| 2007/0170324 | A1* | 7/2007 | Lee et al. ....................... | 248/247 |
| 2007/0172971 | A1* | 7/2007 | Boroson ......................... | 438/26 |
| 2007/0176548 | A1* | 8/2007 | Kim et al. ...................... | 313/512 |
| 2007/0195044 | A1* | 8/2007 | Uemoto .......................... | 345/92 |
| 2007/0247068 | A1* | 10/2007 | Park ............................... | 313/512 |

(Continued)

FOREIGN PATENT DOCUMENTS

| JP | 3496590 | 11/2003 |
|---|---|---|
| KR | 10-2001-0037144 | 5/2001 |
| KR | 10-0473998 | 2/2005 |
| KR | 10-2007-0010627 | 1/2007 |

*Primary Examiner* — Lisa Lea Edmonds
*Assistant Examiner* — Xanthia C Cunningham
(74) *Attorney, Agent, or Firm* — Robert E. Bushnell, Esq.

(57) ABSTRACT

An organic light emitting diode display having a display panel comprising a first substrate and a second substrate disposed facing the first substrate, the first substrate comprising a display area and a pad area, a buffer member disposed on one surface of the first substrate, the buffering member having a buffer layer and an adhesive layer formed on at least one surface of the buffer layer, and a bezel or a case accommodating the display panel and buffer member.

15 Claims, 19 Drawing Sheets

(56) References Cited

U.S. PATENT DOCUMENTS

| | | | |
|---|---|---|---|
| 2008/0074036 A1* | 3/2008 | Wang et al. | 313/504 |
| 2008/0142791 A1* | 6/2008 | Kim et al. | 257/40 |
| 2008/0218091 A1* | 9/2008 | Jo et al. | 315/169.3 |
| 2008/0252203 A1* | 10/2008 | Lee | 313/504 |
| 2008/0278070 A1* | 11/2008 | Kim | 313/504 |
| 2009/0009046 A1* | 1/2009 | Oh et al. | 313/1 |
| 2009/0065385 A1* | 3/2009 | Kakuta et al. | 206/316.1 |
| 2009/0068917 A1* | 3/2009 | Kim | 445/25 |
| 2009/0108740 A1* | 4/2009 | Kim et al. | 313/504 |
| 2009/0167171 A1* | 7/2009 | Jung et al. | 313/504 |
| 2009/0174317 A1* | 7/2009 | Jung et al. | 313/504 |
| 2009/0174825 A1* | 7/2009 | Yee et al. | 348/801 |
| 2009/0207560 A1* | 8/2009 | Lee | 361/679.01 |
| 2009/0256471 A1* | 10/2009 | Kim et al. | 313/504 |
| 2009/0261718 A1* | 10/2009 | Ha et al. | 313/504 |
| 2009/0263597 A1* | 10/2009 | Wu et al. | 428/34.1 |
| 2009/0267526 A1* | 10/2009 | Sung et al. | 315/169.3 |
| 2009/0322214 A1* | 12/2009 | Lee et al. | 313/504 |
| 2010/0084674 A1* | 4/2010 | Paetzold et al. | 257/98 |

\* cited by examiner

ORGANIC LIGHT EMITTING DIODE DISPLAY

CLAIM OF PRIORITY

This application makes reference to, incorporates the same herein, and claims all benefits accruing under 35 U.S.C. §119 from applications both earlier filed in the Korean Intellectual Property Office on 5 Jan. 2011 and there duly assigned Ser. Nos. 10-2011-0001002 and 10-2011-0000994, respectively.

BACKGROUND OF THE INVENTION

1. Field of the Invention

The present invention described technology relates generally to an organic light emitting diode display, and more particularly, to a module of an organic light emitting diode display.

2. Description of the Related Art

Among various display panels for a display device, a display panel using an organic light emitting diode (OLED) has been receiving attention according to the abrupt advance of semiconductor technology.

An active matrix type of OLED display using an organic light emitting diode includes a plurality of pixels arranged on a substrate in a matrix form and thin film transistors (TFTs) disposed at each of the pixels, such that each of the pixels is independently controlled through one of the thin film transistors. The OLED usually includes a hole injection electrode, an organic emission layer, and an electron injection electrode. The OLED emits light by energy that is generated when excitons (which are formed by coupling of holes that are received from the hole injection electrode and electrons that are received from the electron injection electrode) within the organic emission layer drop to a ground state.

Based on this principle, an OLED display has self-emitting characteristics, and the weight and thickness of the OLED display device can be reduced since the OLED display does not require an additional light source, unlike a liquid crystal display device. In addition, the OLED display exhibits quality characteristics such as low power consumption, high luminance, high response speed, and as such, it is used for mobile electronic display devices.

In general, an OLED display is constructed with a display panel including two substrates that are fixed by a sealant, a bezel that is combined to the display panel, and a printed circuit board that is electrically connected to the display panel through a flexible printed circuit (FPC), collectively forming a module.

Unlike a liquid crystal display in which a structure such as a backlight unit is positioned between the display panel and the bezel, in an OLED, because no structure exists between the display panel and the bezel, any impact is directly transmitted to the display panel; this transfer of impact occurs in a sudden situation such as when the device is dropped, whereby the display panel may be easily damaged.

In other words, when an external impact such as a drop impact is applied to the OLED display, this impact is concentrated on the display panel assembly. Thus, the display panel assembly is easily damaged.

Moreover, when an external impact is applied to the bezel supporting the display panel assembly, a considerable distortion load or a considerable bending load would be instantly applied to the bezel, thereby deforming the bezel. As a result, the distortion load and the bending load would be transferred to the display panel assembly, on which the bezel is supported, to damage the display panel assembly.

Therefore, the OLED display should have such characteristics as not to be easily damaged by a drop caused by a user's carelessness according to its use environment so that it can perform excellent functions as a display device.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an organic light emitting diode (OLED) display with excellent mechanical strength characteristics.

An exemplary embodiment provides an OLED display including: a first substrate and a second substrate disposed facing the first substrate, the first substrate including a display area and a pad area; and a buffer member disposed on one surface of the first substrate, the buffering member including a buffer layer and an adhesive layer formed on at least one surface of the buffer layer.

The buffer layer may include sponge or urethane.

The buffer layer may have a thickness ranging from 0.1 mm to 0.3 mm, and the adhesive layer may have a thickness ranging from 0.02 mm to 0.04 mm.

The display device according to an exemplary embodiment may include a bezel for accommodating a display panel including a first substrate and a second substrate, the display panel being fixed to the bezel by a buffer member.

The buffer member may include a buffer layer and a first adhesive layer and a second adhesive layer respectively formed on opposite surfaces of the buffer layer, and the first adhesive layer may be attached to the display panel and the second adhesive layer may be attached to the bezel. The buffer member may be attached to an entire one surface of the first substrate, and one surface of the buffer member may be in contact with the bottom portion of the bezel.

The buffer member may include a bottom portion and a skirt portion protruding from an edge of the bottom portion and bent perpendicular to the bottom portion, and the buffer member may be contained in the bezel to cover the inside of the bezel.

The bezel may be made of a metal.

The display device according to an exemplary embodiment may include a case for protecting a display panel including a first substrate and a second substrate, and the display panel may be fixed to the case by the buffer member.

The buffer member may include a buffer layer and a first adhesive layer and a second adhesive layer respectively formed on opposite surfaces of the buffer layer, and the first adhesive layer may be attached to the display panel and the second adhesive layer may be attached to the case. The buffer member may be attached to an entire one surface of the first substrate, and one surface of the buffer member may be in contact with the bottom portion of the case.

The case may be made of plastic.

The display device according to an exemplary embodiment may include: a bezel for accommodating a display panel including a first substrate and a second substrate; and a case enclosing the bezel, wherein the buffer member may include first and second buffer members, and the first buffer member may be disposed between the display panel and the bezel and the second buffer member may be disposed between the bezel and the case.

In another exemplary embodiment, the OLED display further comprises a case for accommodating a display panel assembly including the first substrate and the second substrate, the buffer member may be disposed between the display panel assembly and the case, and the case may have a thickness ranging from 0.4 mm to 1.5 mm.

The case may be made of one or more of a resin-based material including polycarbonate (PC), and a metal-based material including stainless steel (SUS), magnesium (Mg), aluminum (Al), and their alloys.

The case may include a bottom portion contacting the buffer member and a side wall portion protruding and extending from the bottom portion and enclosing at least part of the sides of the display panel assembly, and the side wall portion may be spaced apart from a predetermined distance from the sides of the display panel assembly.

The predetermined distance may be greater than 0.5 mm.

According to an exemplary embodiment, a buffer member is formed between the display panel and a bezel for accommodating the display panel. Thus, the buffer member is configured to absorb an external impact when the display panel is dropped due to a user's carelessness before the display panel does, thereby effectively protecting the display panel and improving the mechanical strength of the display panel.

Moreover, according to the exemplary embodiment, the OLED display can improve impact resistance and have a simplified structure.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
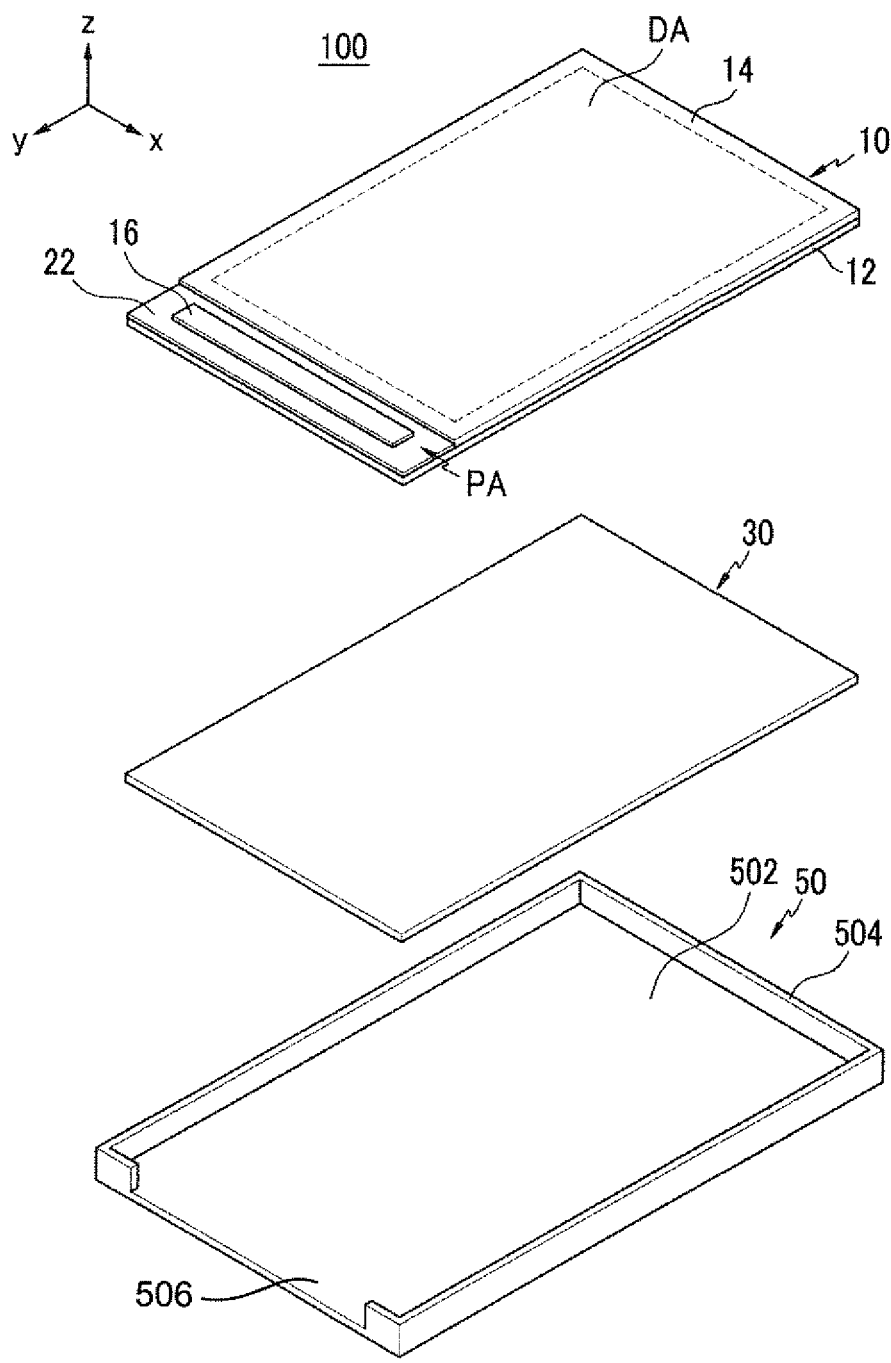
FIG. 1 is an exploded perspective view of an OLED display according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

To clearly describe the present invention, parts not related to the description are omitted, and like reference numerals designate like components throughout the specification.

In the drawings, the sizes and thicknesses of the components are merely shown for convenience of explanation, and therefore the embodiments are not limited to the illustrations described and shown herein. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout this specification and the claims that follow, when an element is described as being "coupled" to another element, the element may be "directly coupled" to the other element. In addition, unless explicitly described to the contrary, the word "comprise" and variations such as "comprises" or "comprising", will be understood to imply the inclusion of stated elements but not the exclusion of any other elements.

Figure 2:
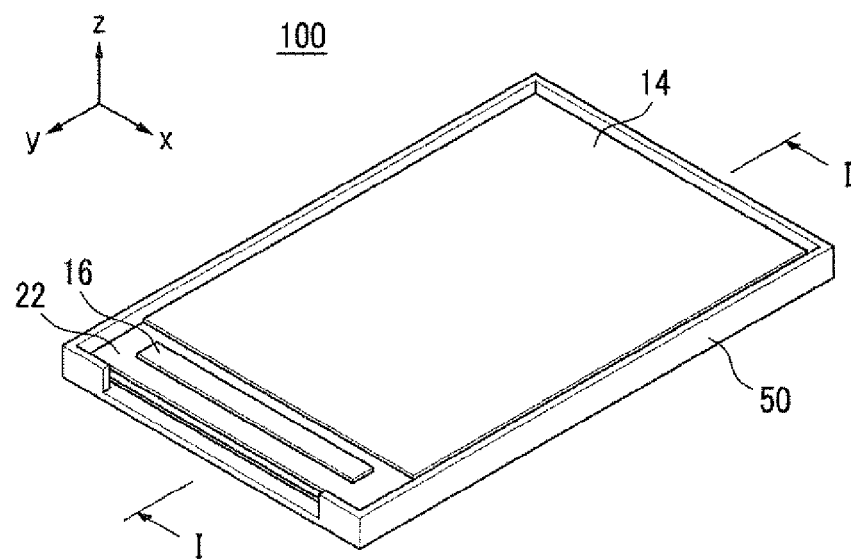
FIG. 2 is a perspective view showing a coupled state of the OLED display shown in FIG. 1.

FIG. 1 is an exploded perspective view of an OLED display 100 according to a first exemplary embodiment. FIG. 2 is a perspective view showing that a display panel 10 shown in FIG. 1 and a buffer member 30 are accommodated in a bezel 50.

Referring to FIG. 1 and FIG. 2, the OLED display 100 includes a display panel 10 for displaying an image, a buffer member 30, and a bezel 50.

The display panel 10 may be used for mobile devices such as cellular phones, for example. However, in the present invention, the display panel 10 is not limited to mobile devices, but may be used for large-sized displays such as TV.

The display panel 10 includes a first substrate 12 and a second substrate 14 that is smaller than the first substrate 12.

A display area DA for substantially displaying an image is formed on the display panel 10. For example, when the display device 100 has an active matrix (AM) structure, an organic light emitting diode (OLED), and a thin film transistor (TFT) for driving the OLED, wires electrically connecting the OLED and the TFT may be formed on first substrate 12 within a region corresponding to the display area DA. In addition, in the first substrate 12, a pad area PA is formed in a portion that extends beyond the edge of the second substrate 14, and pads (not shown) that extend from the wires of display area DA are positioned in the pad area PA. The pads are electrically connected to a printed circuit board (not shown) through a flexible printed circuit board (not shown).

An integrated circuit chip 16 is provided in the pad area PA of the first substrate 12 to control the display panel 10. IC chip 16 generates a plurality of timing signals for applying a data driving signal and a gate driving signal at appropriate points in time. IC chip 16 applies each of the signals to a data line and a gate line of display panel 10. A passivation layer 22 is formed around the integrated circuit chip 16 to protect the integrated circuit chip 16.

In the flexible printed circuit board, electronic circuit elements (not shown) for processing a driving signal are mounted and a connector (not shown) for transmitting an external signal to the flexible printed circuit board is provided.

The bezel 50 accommodates the display panel 10 and the buffer member 30 therein, and is fixedly installed in a case of an actual appliance.

The bezel 50 includes a bottom portion 502 corresponding to the size of display panel 10 and a skirt portion 504 that is oriented in disposition to be perpendicular with a predetermined height from an edge of the bottom portion 502. Here, a section 506 of the skirt portion 504 in which the flexible printed circuit board is disposed is cut out in consideration of, and in conformance with, the size of flexible printed circuit board so that flexible printed circuit board may be positioned without interference.

The bezel 50 may be made of a material having relatively high strength in order to protect the display panel 10. For example, the bezel 50 may be made of a metal material such as steel use stainless (SUS) having constant strength, steel plate cold commercial (SPCC), aluminum, and a nickel-silver alloy. Therefore, the display panel can be efficiently protected from the external impact. The material from which the bezel 50 is fabricated is not limited to these materials.

Meanwhile, in the present exemplary embodiment, the buffer member 30 is disposed between the display panel 10 and the bezel 50. The buffer member 30 is disposed in contact with the bottom portion 502 of the bezel 50, and absorbs an external impact before the display panel 10 does.

The buffer member 30 may be made of a material having weaker strength compared with the bezel 50. That is, the buffer member 30 needs to have relatively weak strength so that the display panel 10 may not be broken by an impact because the buffer member 30 is in direct contact with the display panel 10. The buffer member 30 may be made of a rubber material. For example, the buffer member 30 may be formed of sponge formed by foaming a rubber solution or urethane obtained by fabricating a rubber solution as a synthetic resin. Accordingly, if the display device 100 is dropped due to a user's carelessness or an object is dropped on a local region of the display device 100, the buffer member 30 absorbs the impact or distributes the impact concentrated on the local region, thereby effectively preventing damage of the display panel 10.

Figure 3:
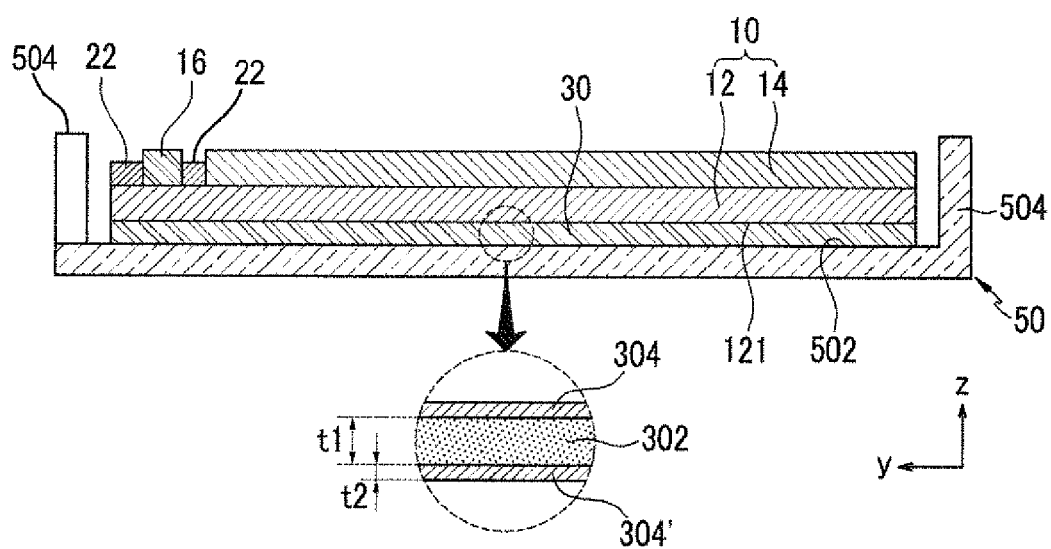
FIG. 3 is a cross-sectional view taken alone line I-I of FIG. 2.

FIG. 3 is a cross-sectional view taken alone line I-I of FIG. 2.

Referring to FIG. 3, when the display panel 10 is installed in the bezel 50, the buffer member 30 is inserted and installed between the display panel 10 and the bezel 50. At this point, an empty space can be formed between an edge of the display panel 10 and the skirt 504 of the bezel 50 with a predetermined gap therebetween. The buffer member 30 reaches the rear surface 121 of the first substrate 12 of the display panel 10 and the bottom portion 501 of the bezel 50, respectively. The buffer member 30 may have a size corresponding to the size of the first substrate 12 and cover the entire rear surface 121 of the first substrate 12. However, if necessary, it may cover only part of the rear surface 121. The buffer member 30 plays the role of a fixing portion for fixing the display panel 10 to the bezel 50 and the role of a protector for protecting the display panel 10 by absorbing an external impact.

As shown in the enlarged circle of FIG. 3, the buffer member 30 includes a buffering layer 302, a first adhesive layer 304, and a second adhesive layer 304'. The first adhesive layer 304 and the second adhesive layer 304' are attached to the rear surface 121 of the first substrate 12 and the bottom portion 502 of the bezel 50, respectively. They may be formed in the form of a release film, and if necessary, may be attached to the rear surface of the first substrate 12 and the entire bottom portion of the bezel 50 or attached to some part thereof. FIG. 3 illustrates the case in which the first adhesive layer 304 and the second adhesive layer 304' are respectively attached to the entire rear surface 121 of the first substrate 12 and nearly the entre bottom portion 502 of the bezel 50.

With the above-described structure, the OLED display 100 requires no adhesive tape for fixing the display panel 10 to the bezel 50. As such, the buffer member 30 may perform the buffering function, and preferably has a thickness that enables the thinning of the OLED display 100. For example, the thickness t1 of the buffering layer 302 may range from 0.1 to 0.3 mm, and the thickness t2 of the adhesive layers may range from 0.02 to 0.04 mm.

The OLED display 100 according to an exemplary embodiment can increase the mechanical strength due to the buffer member 30 disposed between the display panel 10 and the bezel 50, which will be described below.

The inventor of the present invention conducted a dropping test as follows. A display device of Comparative Example that does not have the buffer member of the OLED display 100 of the above-described exemplary embodiment was mounted in dropping jigs, respectively, and the dropping jigs were dropped to determine whether or not the display panel 10 was damaged.

Figure 4:
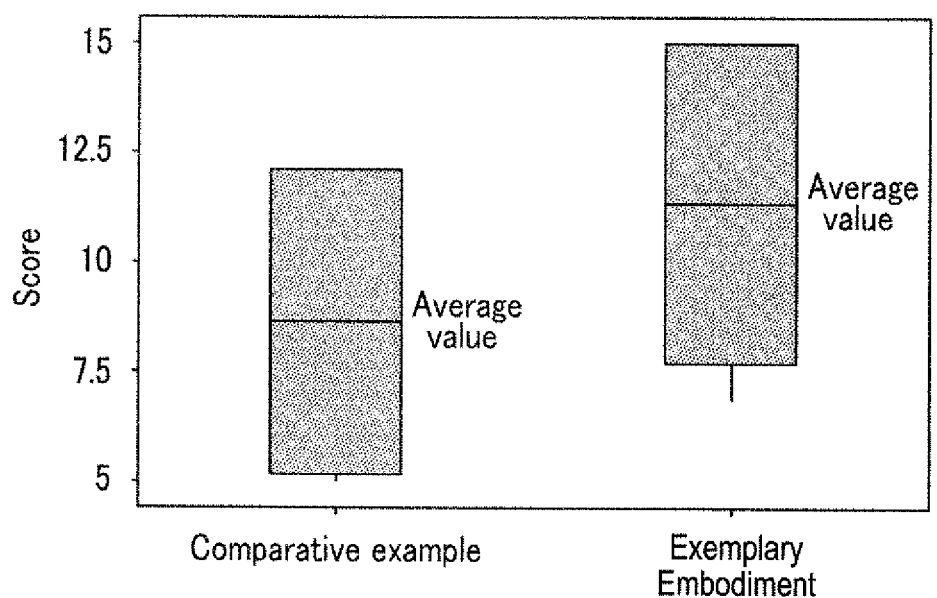
FIG. 4 is a graph showing dropping scores of the OLED displays according to an Exemplary Embodiment and a Comparative Example of the present invention.

FIG. 4 is a graph showing dropping scores in dropping test results due to the display panel of an Exemplary Embodiment and a Comparative Example being dropped. In FIG. 4, the dropping scores in a vertical axis were obtained as follows: a good result was scored as 1; a bad result was scored as 0; and the dropping scores of a total of eighteen times were summed.

Referring to FIG. 4, a Comparative Example exhibited an average dropping score of 8.5. In contrast, it can be noted that the display device of this Exemplary Embodiment exhibited an average dropping score of 12.0.

Moreover, the inventor of the present invention conducted a simulation of the impact absorption amount of the display panel caused by an impact when dropped according to the OLED display 100 of the above-described exemplary embodiment and the OLED display of a Comparative Example using pads made of polycarbonate. Specifically, a ball made of steel having a diameter of 17.3 mm at a position 20 cm away from the OLED display 100 was dropped on the display device. Then, a simulation of the amount of impact absorbed into the display panel with the passage of time was conducted.

Figure 5:
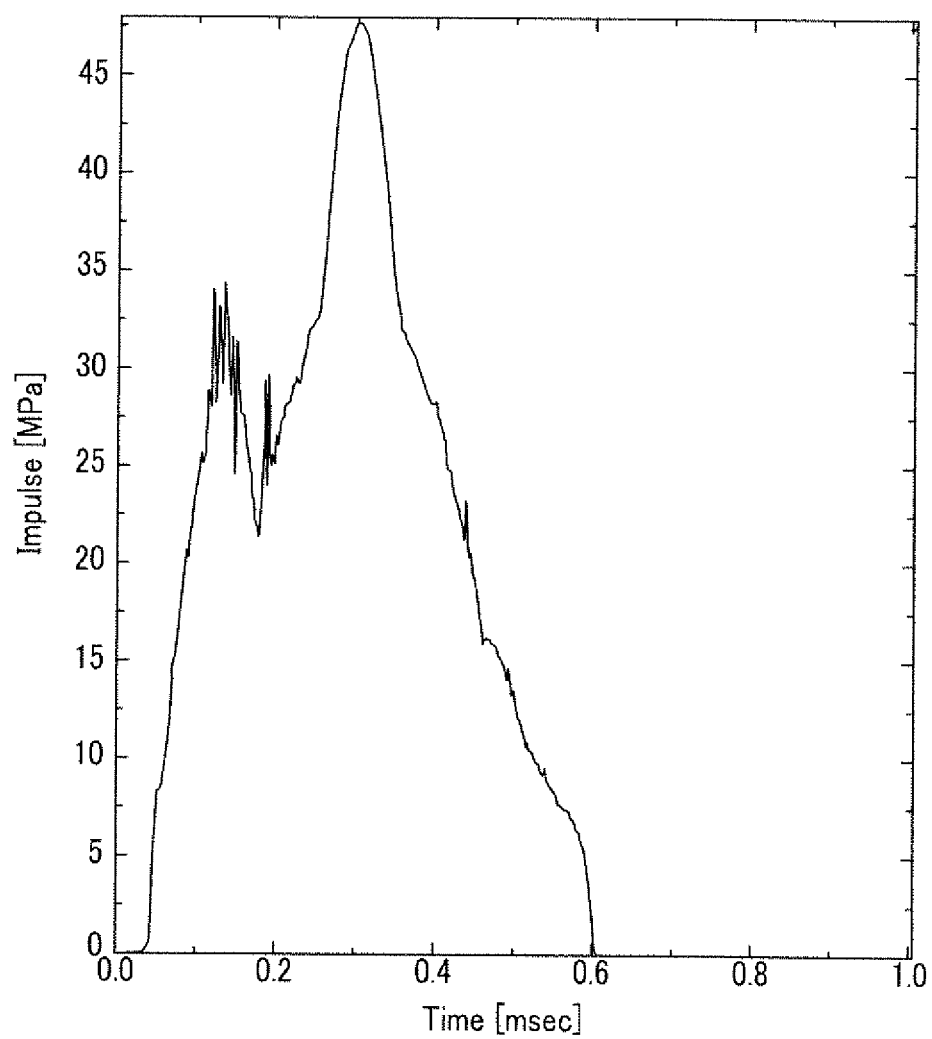
FIGS. 5 and 6 are graphs showing simulation results of the amount of impact caused when the OLED displays according to an Exemplary Embodiment and a Comparative Example of the present invention.
Figure 6:
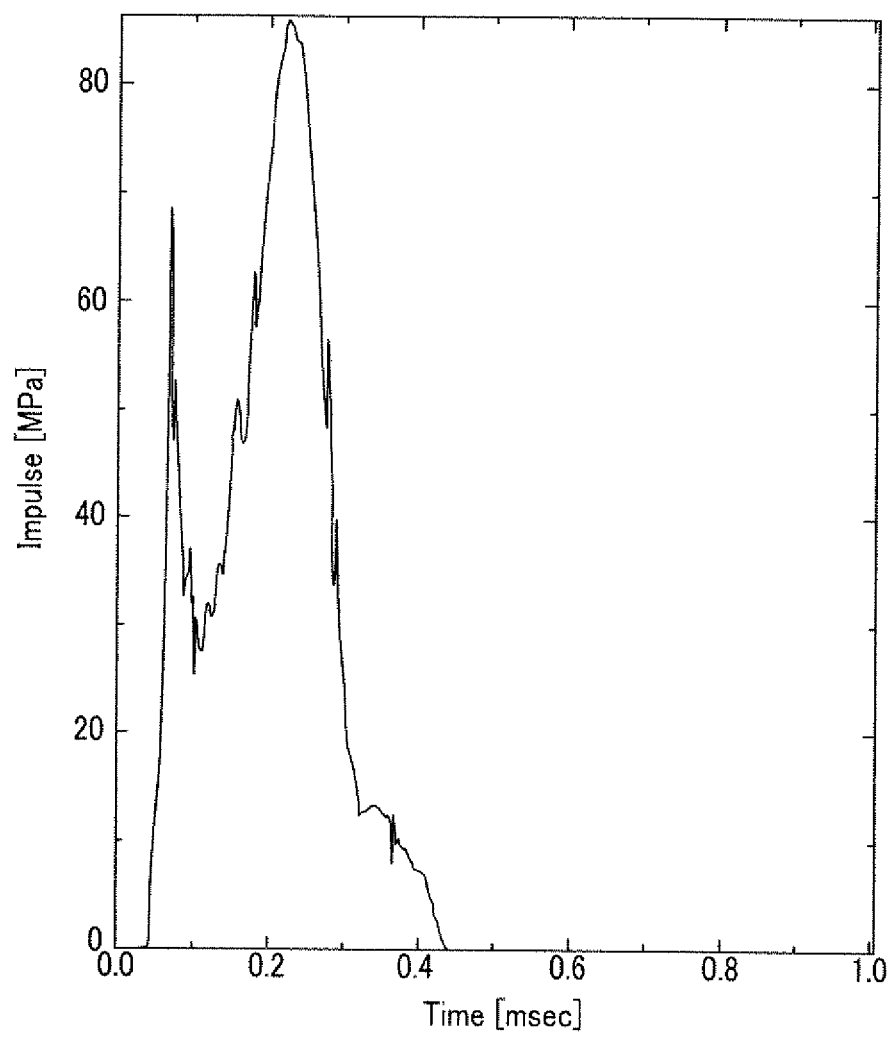

FIG. 5 and FIG. 6 are graphs showing simulation results of the above Exemplary Embodiment and Comparative Example.

Referring to FIG. 5 and FIG. 6, even if an impact is applied to a local region of the display panel 10 of the OLED display 100 of the Exemplary Embodiment under the same dropping test condition, the impact is distributed by the buffer member 30 including a sponge. Thus, the maximum amount of impact absorbed into the display panel 10 was 48 Mpa (megapascal). In contrast, the maximum amount of impact absorbed into a light emitting surface in the OLED display of Comparative Example was 85 MPa. That is, the present Exemplary Embodiment improved the impact resistance of the OLED display 100 by means of the buffer member 30, and, as a result, reduced damage of the display panel 10 by alleviating even an impact applied to the local region of the display panel 10.

Figure 7:
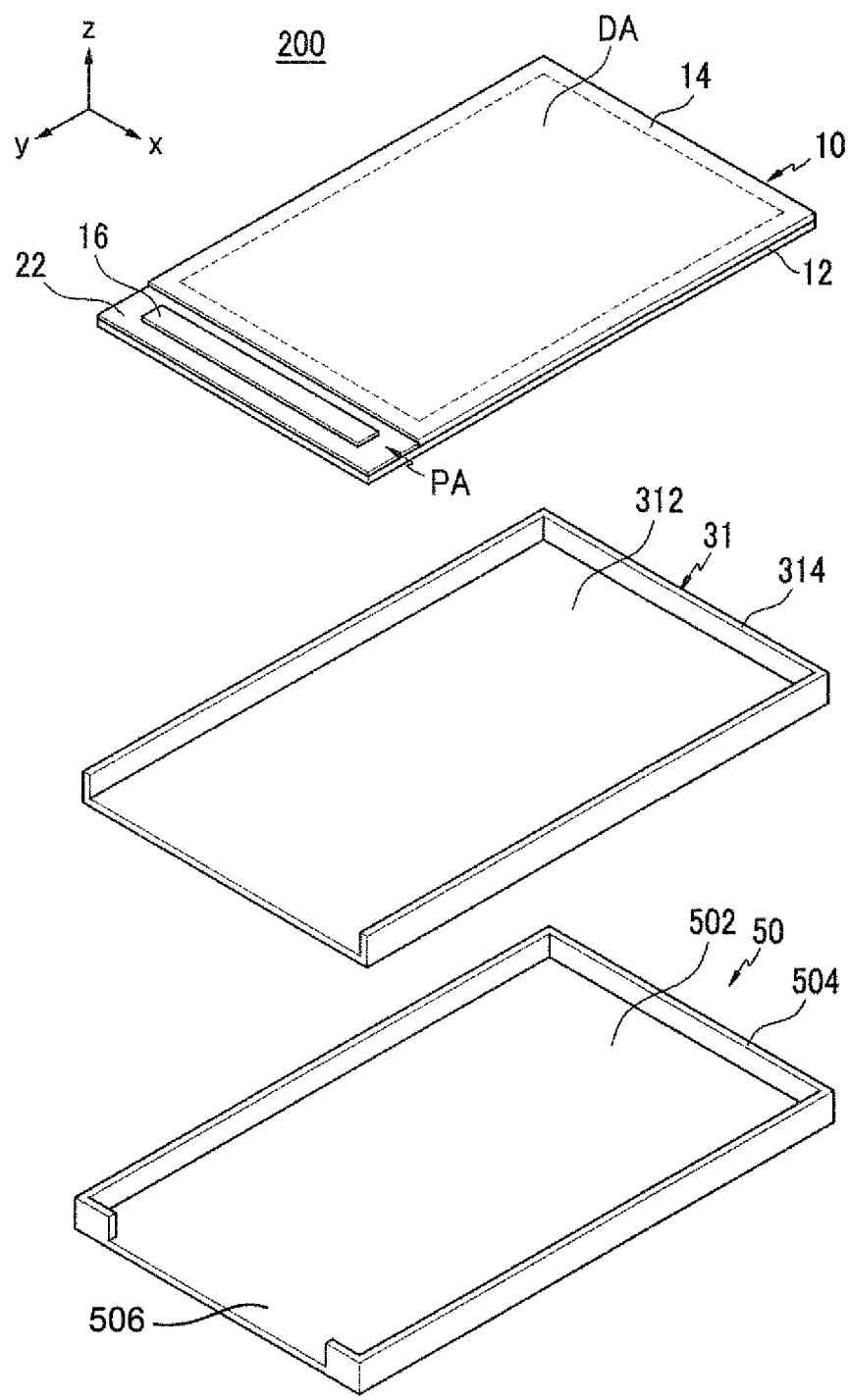
FIG. 7 is an exploded perspective view showing an OLED display according to a second exemplary embodiment.
Figure 8:
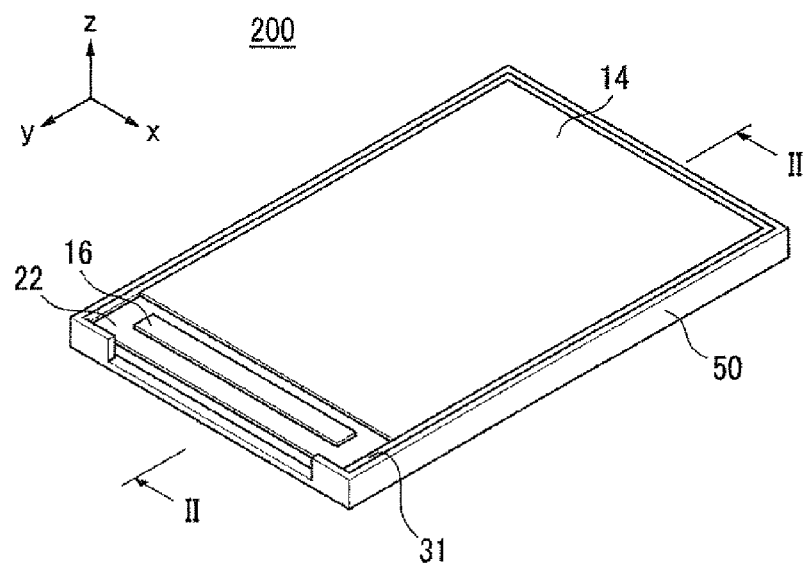
FIG. 8 is a perspective view of a coupled state of the display device of FIG. 7.
Figure 9:
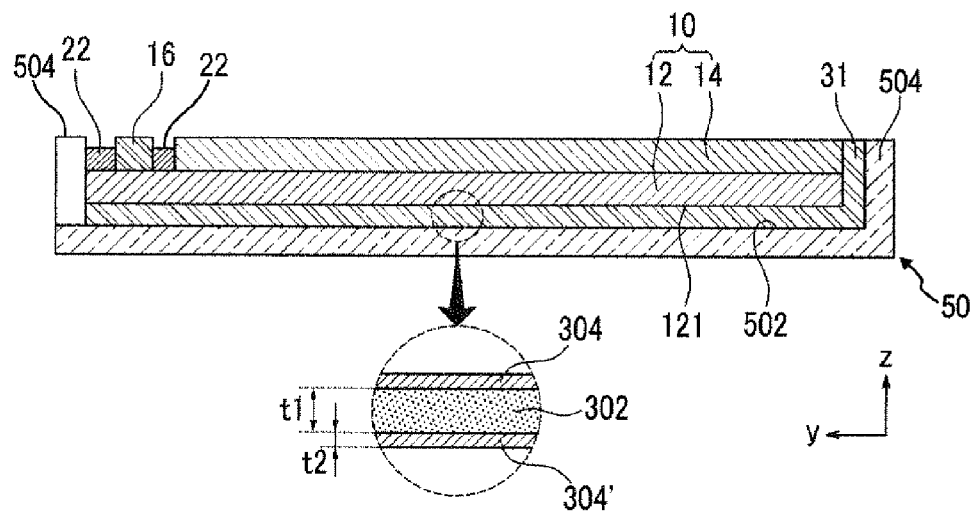
FIG. 9 is a cross-sectional view taken along line II-II of FIG. 8.

FIG. 7 is an exploded perspective view showing an OLED display 200 according to a second exemplary embodiment, FIG. 8 is a perspective view of a coupled state of the display device of FIG. 7, and FIG. 9 is a cross-sectional view taken along line II-II of FIG. 8. In FIGS. 7 to 9, for convenience, like reference numerals will be used for like elements of the OLED display 100 of FIG. 1 and the description thereof omitted where not pertinent to the discussion of the second embodiment.

Referring to FIGS. 7 to 9, the OLED display 200 includes a display panel 10, a buffer member 31, and a bezel 50.

The buffer member 31 is disposed between the display panel 10 and the bezel 50, and fixes them together. The buffer member 31 comprises a bottom portion 312 and a skirt portion 314 so as to correspond to the shape of the bezel 50. Here, the bottom portion 312 and the skirt portion 314 are formed integral with each other, and the skirt portion 314 is connected to three edges of the bottom portion 312.

With respect to FIGS. 7 to 9, the skirt portion 314 extends from the bottom portion 312 in the +x-axis direction, the +y-axis direction, and the +z-axis direction, respectively. Accordingly, the buffer member 31 is accommodated in the bezel 50. Then, the buffer member 31 reaches the bottom portion 502 and skirt portion 504 of the bezel 50. Of course, if necessary, an empty space may be formed between an edge of the buffer member 31 and the skirt portion 504 with a given gap therebetween. Moreover, the flexible printed circuit board can be positioned without interference because the skirt portion 314 of the buffer member 31 is not formed at a side in which the flexible printed circuit board is disposed.

The buffer member 31 may be formed of the same components and material as the buffer member 30 of the first exemplary embodiment. That is, the buffer member 31 enables the display panel 10 and the bezel 50 to be bonded together as it comprises a buffering layer and an adhesive layer to perform the buffering and adhesion functions.

Although the second exemplary embodiment has been explained and illustrated that the buffer member 31 is fabricated in the form of tape and attached to the inside of the bezel 50, the method for disposing the buffer member 31 in the bezel 50 is not limited thereto.

For example, the buffer member 32 may be prepared by a mixed solution, which is made cohesive by mixing epoxy resin in a phorone solution, a buffering solution.

Figure 10A:
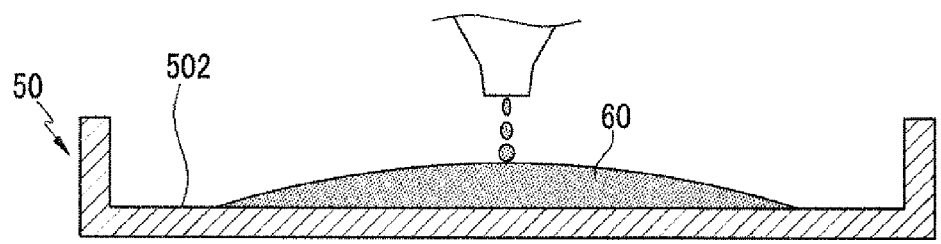
FIGS. 10A to 10C are views for explaining a method for manufacturing a buffer member according to a third exemplary embodiment.
Figure 10B:
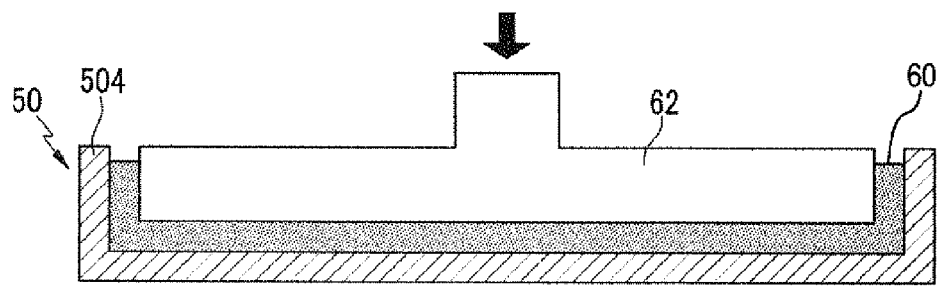
Figure 10C:
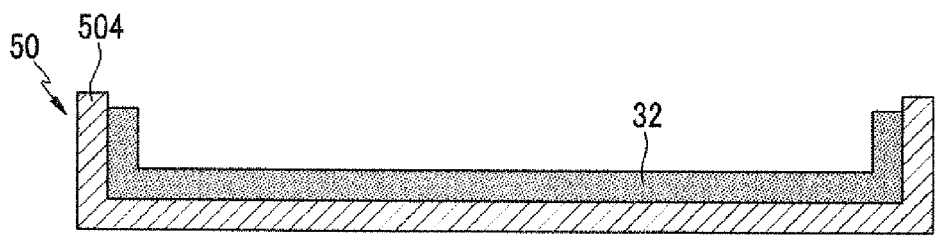

With respect to FIGS. 10A-10C, briefly describing the preparation of the buffer member, the mixed solution 60 is coated to the bottom portion 502 of the bezel 50 (see FIG. 10A). A forming mold 62 corresponding to the size of the display panel 10 is disposed on the coated mixed solution. When the mixed solution 60 is pressurized through the forming mold 62, the mixed solution 60 may spread along the rear surface of the forming mold 62 and be formed between the forming mold 62 and the bezel 50. At this point, the coated mixed solution 60 may be formed between the forming mold 62 and the skirt portion 504 of the bezel 50, as well as on the bottom portion 502 of the bezel 50, depending on the degree of pressurization by the forming mold 62 (see FIG. 10B). Thereafter, after forming buffer member 32 (FIG. 10C) the forming mold 62 is slipped out from the bezel 50. When providing the display panel 10 to the bezel 50, the display panel 10 and the bezel 50 can be coupled by the buffer member 32 made of the mixed solution 60. As the epoxy resin contained in the mixed solution 60 is hardened, the bonding force to the surface is strengthened. Thus, the epoxy resin can perform both of the buffering and adhesion functions, like the buffer member, i.e., buffering tape, 30 or 31 of the above-described exemplary embodiments.

Figure 11A:
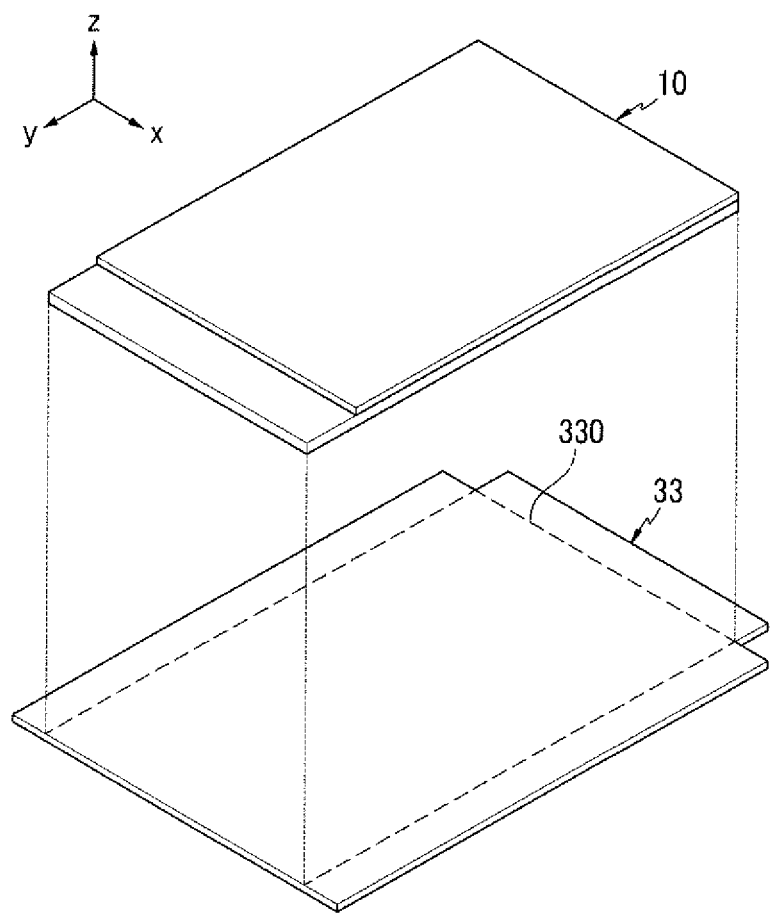
FIG. 11A and FIG. 11B are views for explaining the coupled state between a buffer member and the display panel according to a fourth exemplary embodiment.
Figure 11B:
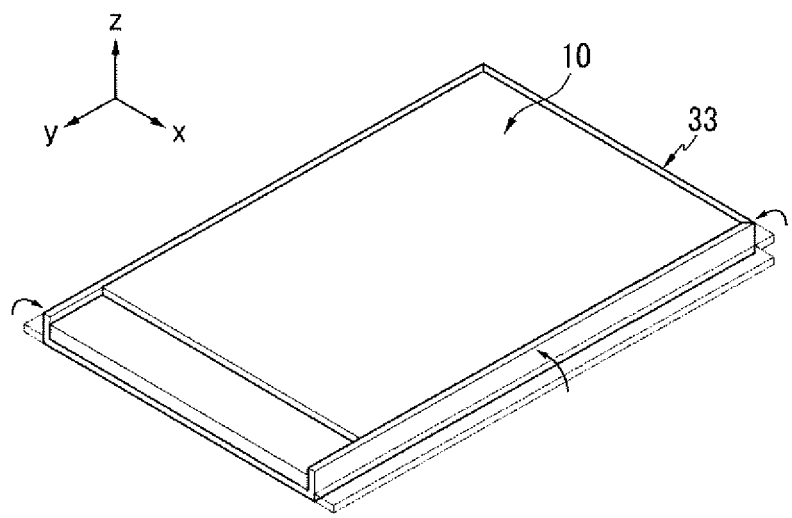

FIG. 11A and FIG. 11B are views for explaining the coupling relationship between a buffer member 33 and the display panel 10 according to a fourth exemplary embodiment. Referring to the drawings, the buffer member 33 of the fourth exemplary embodiment is provided as the same tape (so-called phorone tape) as the second exemplary embodiment, and has an indentation 330 formed along edges. The indentation 330 functions to allow the skirt regions of the buffer member 33, corresponding to sides of the display panel 10, to be easily bent when the display panel 10 is placed on the buffer member 33 (see FIG. 11B) and the corresponding sides of the display panel 10 are covered with the buffer member 33. In this manner, in the fourth exemplary embodiment, the display panel 10 and the buffer member 33 can be coupled in a package type by means of the buffer member 33 prepared in conformation with the size of the display panel 10 for insertion into the bezel (not shown).

Figure 12:
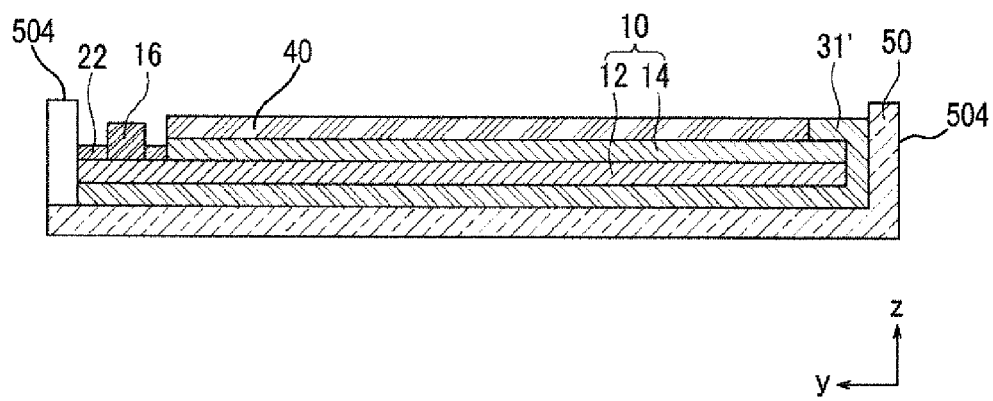
FIG. 12 is a cross-sectional view illustrating a first modified example of the second exemplary embodiment.

FIG. 12 shows a first modified example of the second exemplary embodiment, in which a buffer member 31' disposed between the display panel 10 and the bezel 50 is also disposed and formed on the upper end edge of second substrate 14 of the display panel 10, as well as between the sides of the display panel 10 and the skirt portion 504 of the bezel 50. A transparent protective portion 40, is disposed on second substrate 14 adjacent to the buffer member 31'.

Figure 13:
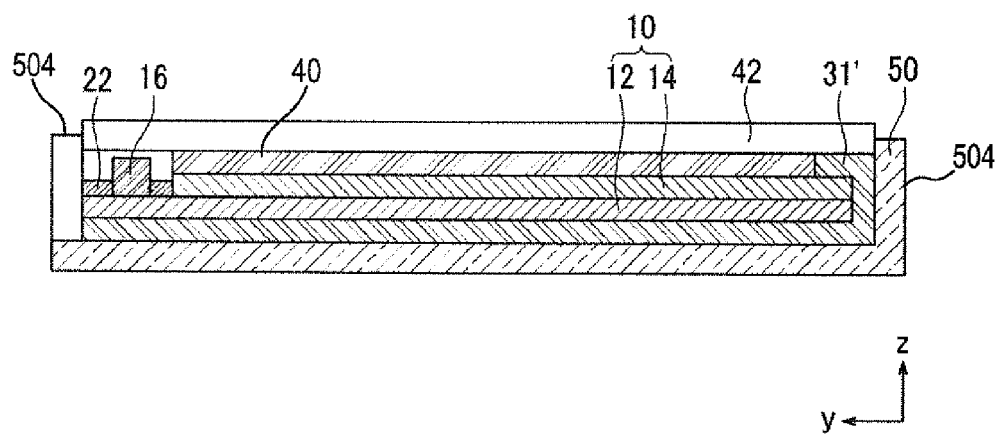
FIG. 13 is a cross-sectional view illustrating a second modified example of the second exemplary embodiment.

FIG. 13 shows a second modified example of the second exemplary embodiment, in which a transparent window 42, is disposed on the buffer member 31' and the transparent protective portion 40 shown in FIG. 12. Here, the transparent window 42 may be coupled integrally with the buffer member 31' and the display panel 10.

Figure 14:
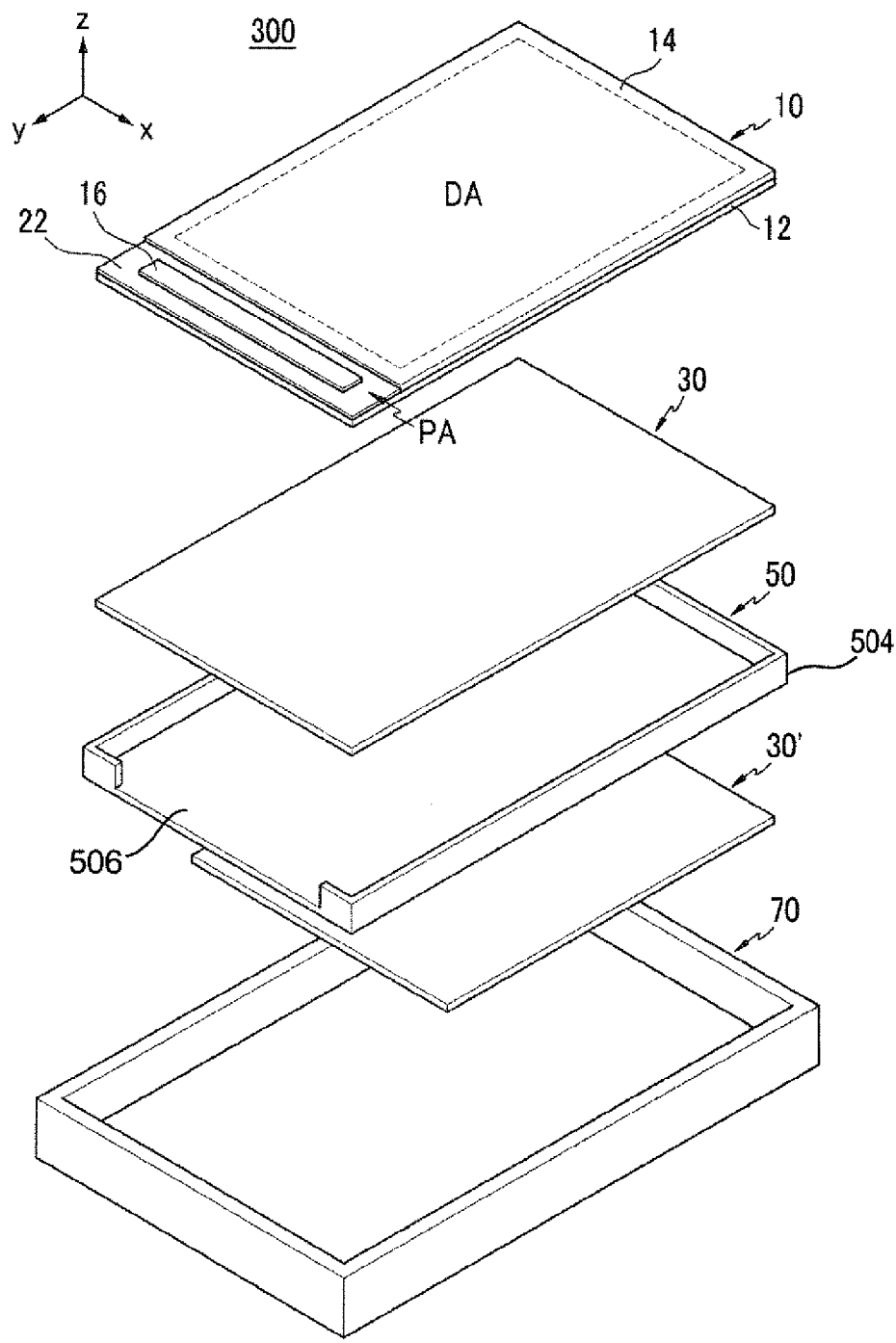
FIG. 14 is an exploded perspective view of an OLED display according to a fifth exemplary embodiment.
Figure 15:
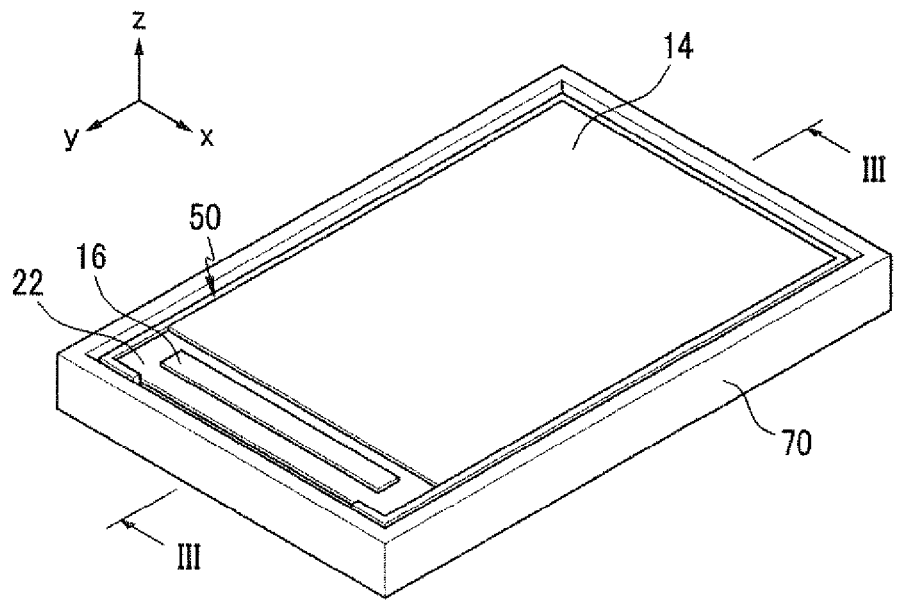
FIG. 15 is a perspective view of a coupled state of the organic light emitting diode of FIG. 14.
Figure 16:
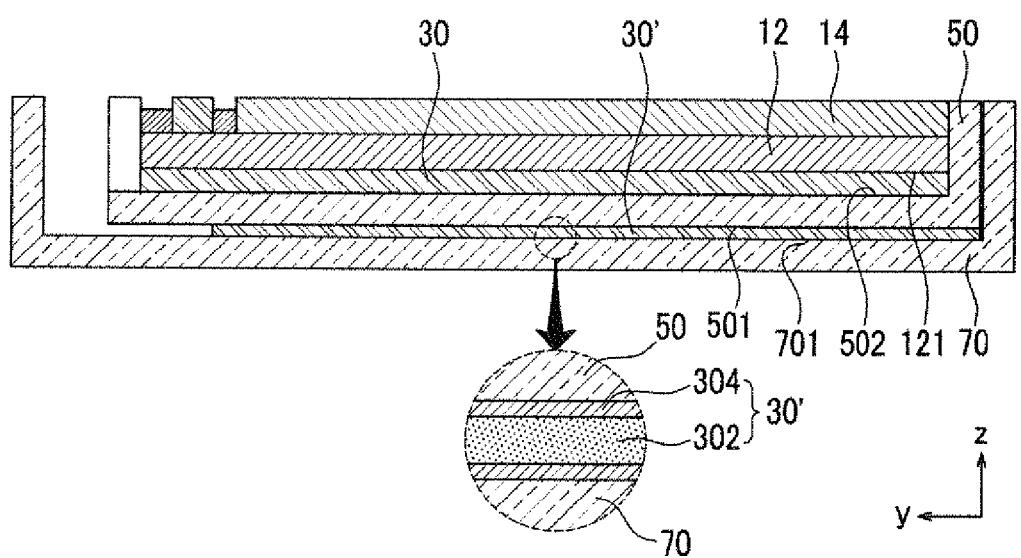
FIG. 16 is a cross-sectional view taken along line III-III of FIG. 15.

FIG. 14 is an exploded perspective view showing an OLED display 300 according to a fifth exemplary embodiment, FIG. 15 is a perspective view of a coupled state of the OLED display 300 of FIG. 14, and FIG. 16 is a cross-sectional view taken along line III-III of FIG. 15.

In FIGS. 14 to 16, for convenience, like reference numerals will be used for like elements of the OLED display 100 of FIG. 1 and the description thereof omitted where not pertinent to the discussion of the fifth embodiment. The OLED display 300 shown in FIGS. 14 to 16 is illustrated to have a structure including a plurality of buffer members 30 and 30'.

Referring to FIGS. 14 to 16, the OLED display 300 includes a display panel 10, a first buffer member 30, a bezel 50, a second buffer member 30', and a case 70.

The first buffer member 30 is disposed between the display panel 10 and the bezel 50 to fix them together, and the second buffer member 30' is disposed between the bezel 50 and the case 70 to fix them together. As in the first exemplary embodiment, the detailed configuration of the first buffer member 30 and the second buffer member 30' includes a buffering layer 302 and an adhesive layer 304.

The first buffer member 30 is attached to the rear surface 121 of the first substrate 12 and an inner bottom surface 502 of the bezel 50. The second buffer member 30' is attached to an outer bottom surface 501 of the bezel 50 and an inner bottom surface 701 of the case 70. At this point, it may be attached to a region corresponding to the display area of the display panel 10. Accordingly, the second buffer member 30' extends from the pad area of the display panel 10. Thus, it can be positioned without interference with the flexible printed circuit board (not shown) disposed outside the bezel 50.

Figure 17:
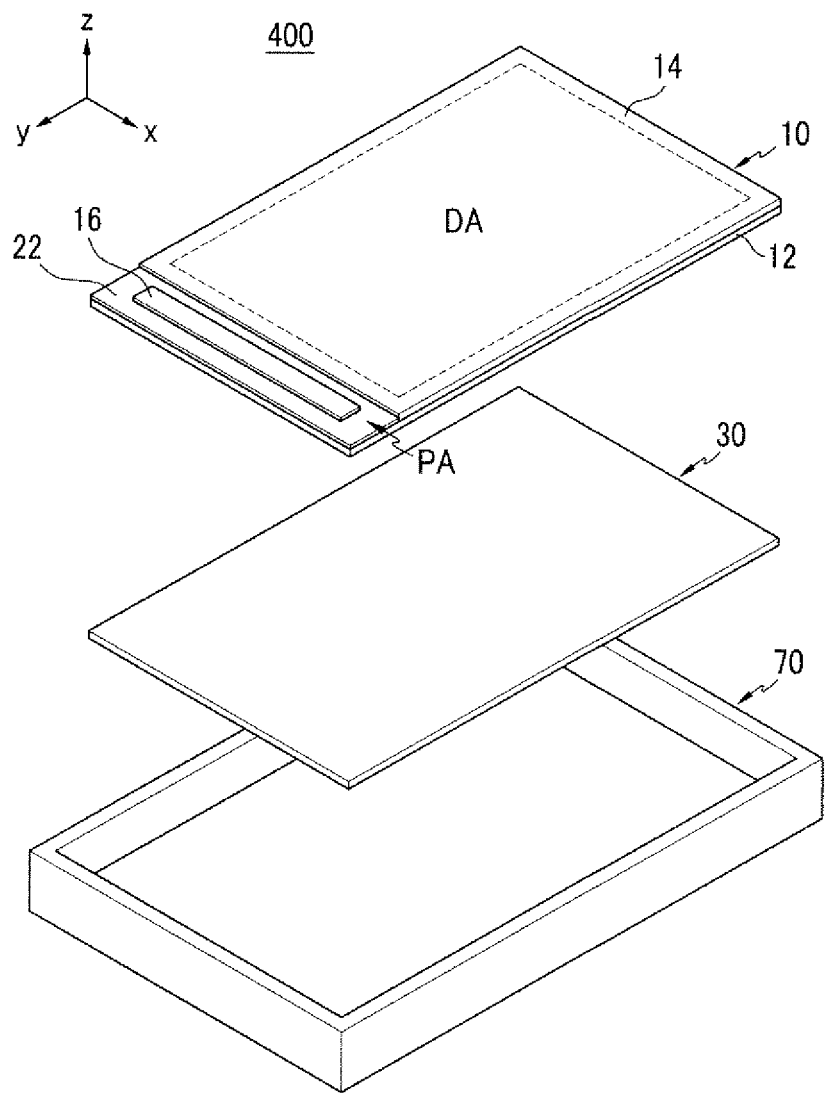
FIG. 17 is an exploded perspective view showing an OLED display according to a sixth exemplary embodiment.
Figure 18:
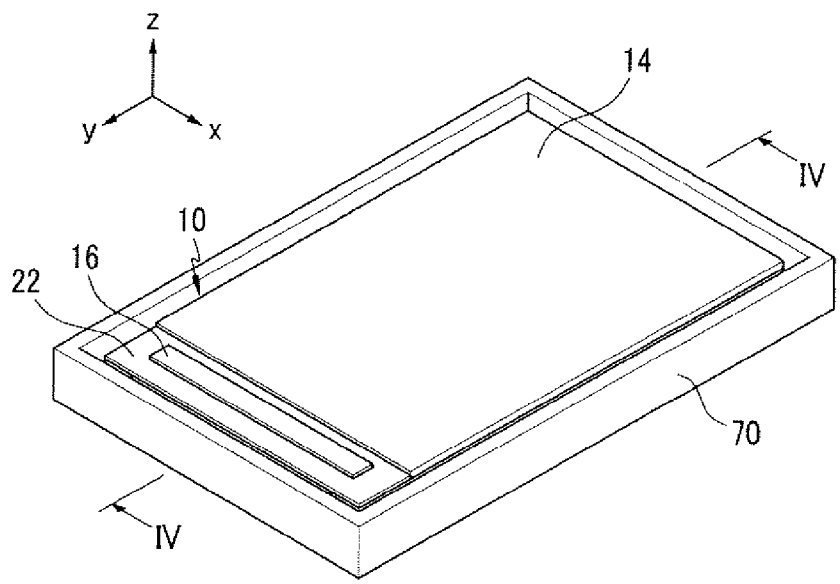
FIG. 18 is a perspective view of a coupled state of the OLED display of FIG. 17.
Figure 19:
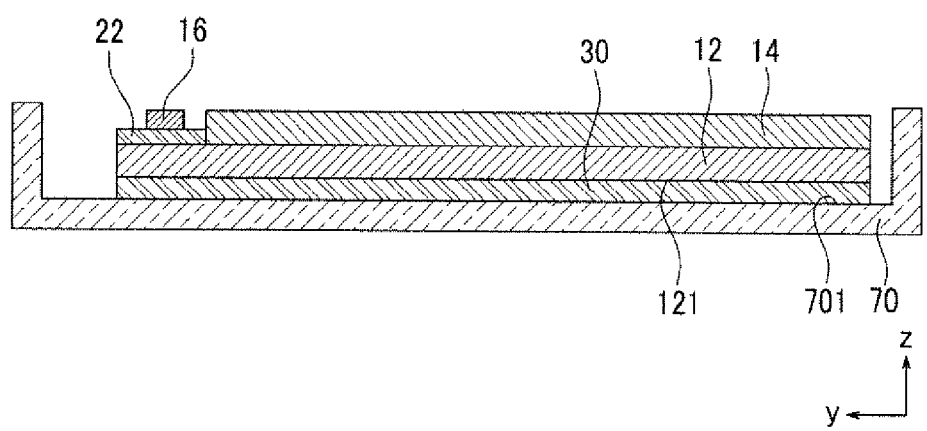
FIG. 19 is a cross-sectional view taken along line IV-IV of FIG. 14.

FIG. 17 is an exploded perspective view showing an OLED display 400 according to a sixth exemplary embodiment, FIG. 18 is a perspective view of a coupled state of the OLED display 400 of FIG. 17, and FIG. 19 is a cross-sectional view taken along line IV-IV of FIG. 14.

The OLED display 400 of FIGS. 17 to 19 is illustrated that the display panel 10 is directly mounted in a case 70 of an actual appliance, rather than being contained in the bezel. In FIGS. 17 to 19, for convenience, like reference numerals will be used for like elements of the OLED display 100 of FIG. 1 and the description thereof omitted where not pertinent to the discussion of the sixth embodiment.

Referring to FIG. 17 to FIG. 19, the OLED display 400 includes a display panel 10 for displaying images, a buffer member 30, and a case 70.

The buffer member 30 is disposed between the display panel 10 and the case 70. The buffer member 30 includes a buffer layer and an adhesive layer as in the above-described first exemplary embodiment, and fixes the display panel 10 to an inner bottom surface 701 of the case 70 while absorbing an external impact. In this case, the display panel 10 of the OLED display 400 is mounted in the case 70 without the use of a bezel. As such, the OLED display 400 can be manufacture to be more compact because the entire thickness of the OLED display 400 is decreased by the thickness of the bezel. Moreover, the manufacturing cost can be reduced, as compared to the fifth embodiment, since the bezel and second buffer member are not used.

Figure 20:
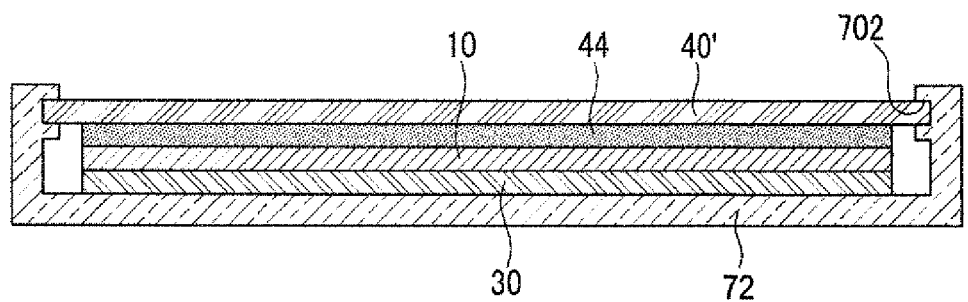
FIG. 20 is a view illustrating a first modified examples of the sixth exemplary embodiment.
Figure 21:
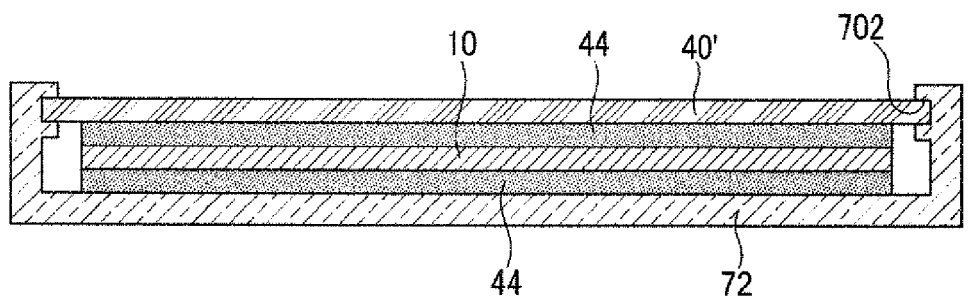
FIG. 21 is a view illustrating a second modified example of the sixth exemplary embodiment.

FIG. 20 and FIG. 21 illustrate modified examples of the sixth exemplary embodiment. FIG. 20 is a first modified example of the sixth exemplary embodiment. In this example, as a rule, the display panel 10 is directly coupled to a case 72, rather than to the bezel, by the buffer member 30, and also coupled to a transparent protective portion 40', similarly to the illustration of FIG. 13. To this end, a gel type resin material 44 is provided between the display panel 10 and the transparent protective portion 40' to couple them together. This resin material 44 may be a material that is transparent and good at impact absorption.

The transparent protective portion 40' may be coupled to the case 72, with its edges being inserted into a groove 702 formed in the case 72.

FIG. 21 is a second modified example of the sixth exemplary embodiment. The second modified example has the same basic configuration as FIG. 20, the difference being that a resin material 44, used for coupling the display panel 10 and the transparent protective portion 40', is also used in place of the buffer member 30 shown in FIG. 20, and is used as means for coupling the display panel 10 and the case 70.

Figure 22:
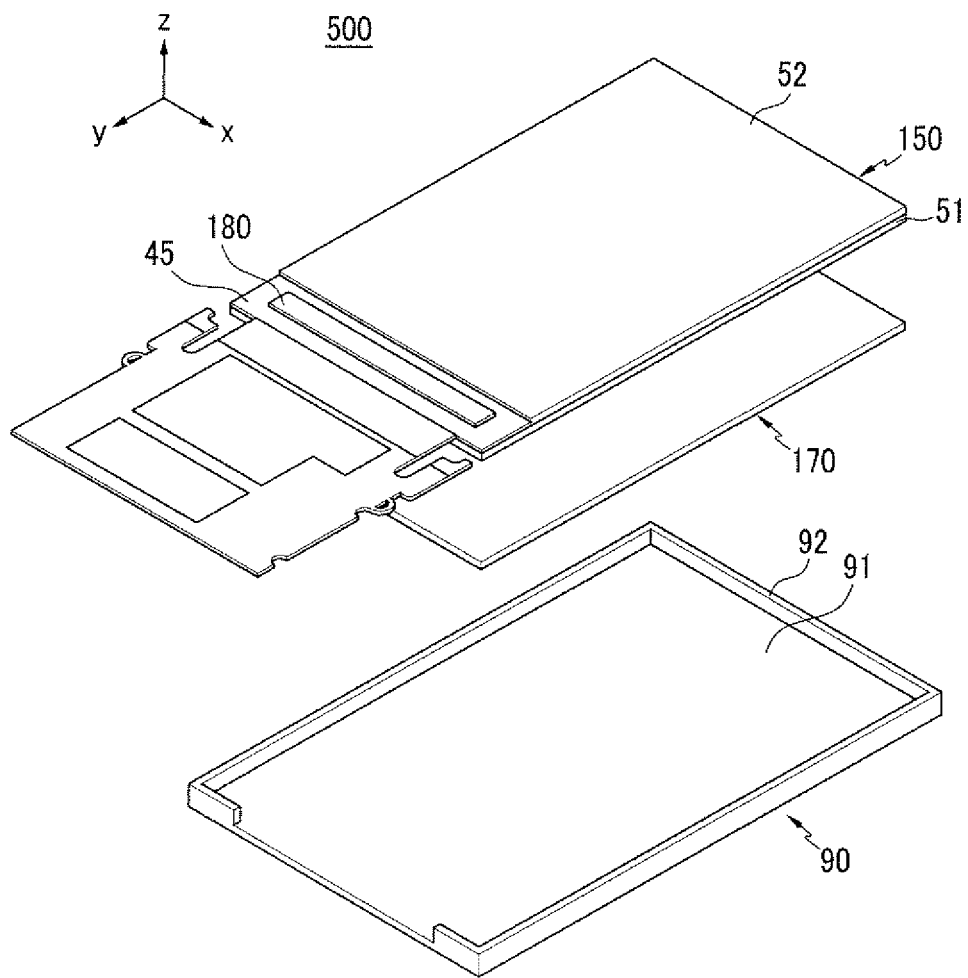
FIG. 22 is an exploded perspective view of an OLED display according to a seventh exemplary embodiment.
Figure 23:
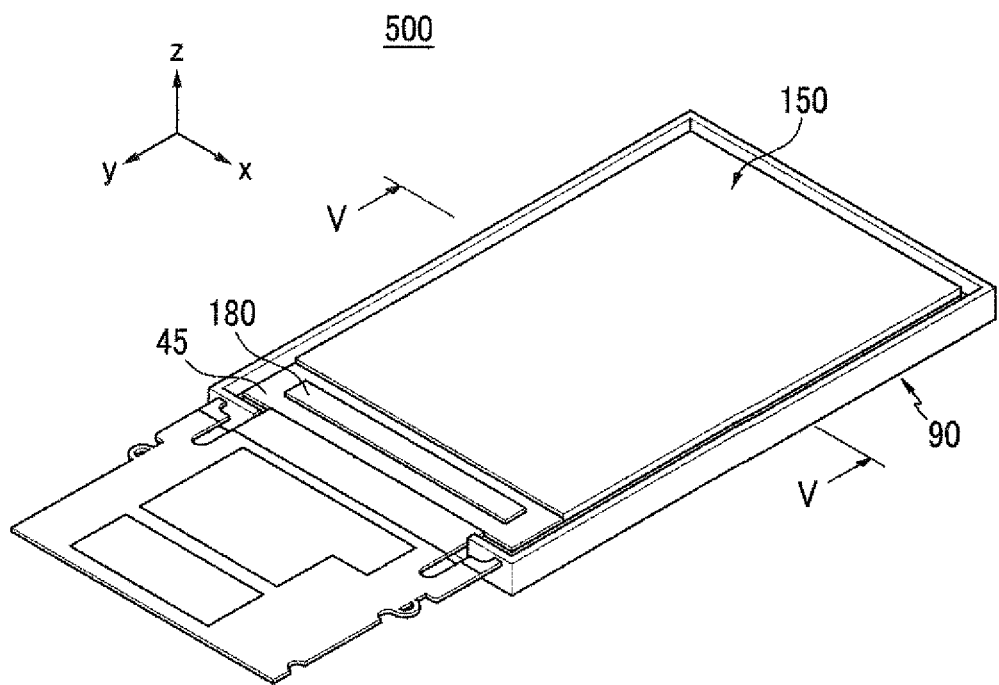
FIG. 23 is a perspective view showing a coupled state of the OLED display of FIG. 22.
Figure 24:
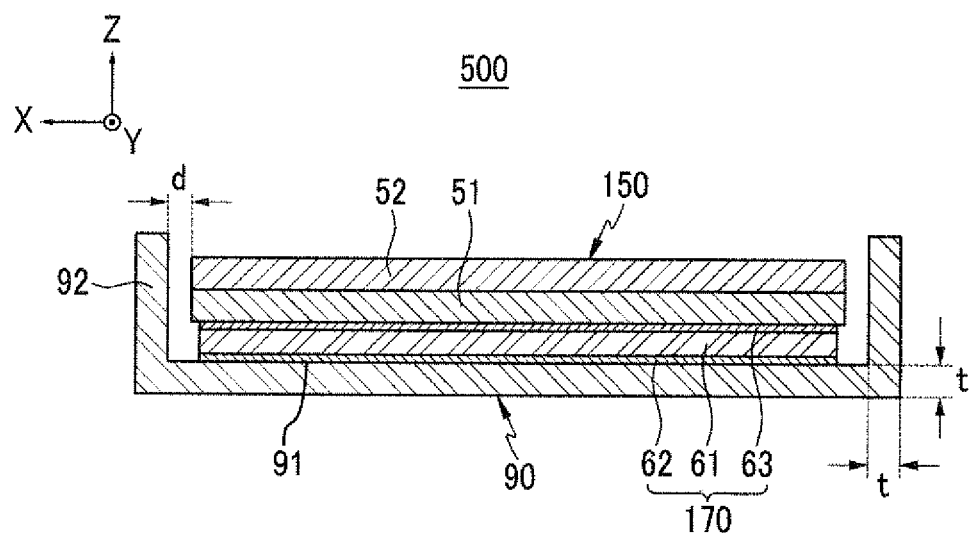
FIG. 24 is a cross-sectional view taken alone line V-V of FIG. 23.

FIG. 22 is an exploded perspective view of an OLED display 500 according to the seventh exemplary embodiment, and FIG. 23 is a perspective view showing a coupled state of the OLED display 500 of FIG. 22. FIG. 24 shows a cross-section taken alone line V-V.

As shown in FIGS. 22 and 23, the OLED display 500 includes a display panel assembly 150, a buffer member 170, and a case 90.

The display panel assembly 150 includes a first substrate 51, a second substrate 52, and an integrated circuit chip 180. The first substrate 51 has a display area and a mounting area. The second substrate 52 is smaller than the first substrate 51, and attached to the display area of the first substrate 51. The first substrate 51 and the second substrate 52 are bonded together by a sealant (not shown) disposed along edges of the second substrate 52. The integrated circuit chip 180 is mounted in the mounting area of the first substrate 51. At this point, the integrated circuit chip 180 is mounted on a plane of the first substrate 51 in the same direction as the plane onto which the second substrate 52 is attached. That is, the second substrate 52 and the integrated circuit chip 180 are disposed to be adjacent to each other. Moreover, the display panel assembly 150 further includes a passivation layer 45 to cover the mounting area to mechanically protect the integrated circuit chip 180 and preventing the mounting area from being corroded.

The first substrate 51 includes pixels (shown in FIGS. 25 and 26) arranged in a matrix form in the display area. Further, the first substrate 51 may further include a scan driver (not shown) and a data driver (not shown) to drive the pixels. Moreover, the first substrate 51 further include pad electrodes (not shown) disposed in the mounting area. The integrated circuit chip 180 is mounted in a chip on glass (COG) manner in the mounting area of the first substrate so as to be electrically connected to a pad electrode (not shown). Additionally, the first substrate 51 further includes wires (not shown) for interconnecting the integrated circuit chip 180, a scan driver (not shown), and a data driver (not shown).

The second substrate 52 is bonded to the first substrate 51 to seal and protect the pixels, circuits, and wires formed on the first substrate 51 from the outside. Besides, the display panel assembly 150 may further include a polarizer (not shown) that is attached to one surface of the second substrate 52 to restrain external light reflection.

The case 90 may also be used as the case of electronic equipment in which the OLED display 500 is included, or may be a part thereof. The case 90 includes a bottom portion 91 and a side wall portion 92. The bottom portion 91 is in contact with the buffer member 170, and the side wall portion 92 protrudes and extends orthogonally from the bottom portion 91 and surrounds at least part of the sides of the display panel assembly 150.

Moreover, as shown in FIG. 24, the side wall portion 92 is spaced apart a predetermined distance d from a side of the display panel assembly 150. Here, the predetermined distance d is greater than 0.5 mm. This is because, if the side wall portion 92 of the case 90 is formed in close contact with the display panel assembly 150, deformation of the case 90 may be transferred as it is to the display panel assembly 150 and cause damage to the display panel assembly 150. That is, the side wall portion 92 is disposed, spaced apart a predetermined distance d from the display panel assembly 150. Thus, when the case 90 is deformed by an external impact, the impact transferred to the display panel assembly 150 can be minimized, and the deformed case 90 can be suppressed from colliding with the display panel assembly 150 and damaging the display panel assembly 150.

Also, the case 90 may be made of one or more of a resin-based material including polycarbonate (PC), and a metal-based material including stainless steel (SUS), magnesium (Mg), aluminum (Al), and their alloys.

The case 90 has a thickness within the range of about 0.4 mm to about 1.5 mm and has proper strength to protect the display panel assembly 150. If the thickness t of the case 90 is less than about 0.4 mm, the case 90 may not have sufficient strength, while if it is larger than about 1.5 mm, the case 90 may have excessive strength and could damage the display panel assembly 150. That is, the case 90 preferably maintains flexural rigidity so as to not have excessive flexibility or rigidity. Also, if the thickness t of the case 90 is too large, it would affect the overall thickness of the OLED display 500, degrading quality of the external appearance of the product.

The buffer member 170 may include a buffer layer 61 and a first adhesive layer 62 and a second adhesive layer 63 formed on opposite surfaces of the buffer layer 61. That is, the buffer member 170 may be formed in the form of a release film. Here, the first adhesive layer 62 is in contact with the bottom portion 91 of the case 90, and the second adhesive layer 63 is in contact with the first substrate 51 of the display panel assembly 150. However, the present invention is not limited thereto. In some cases, the adhesive layers 62 and 63 may be formed on only one of the two surfaces of the buffer layer 61. Further, the buffer layer 61 may have an adhesive force itself.

Although FIG. 22 and FIG. 24 illustrate that the first adhesive layer 62 and the second adhesive layer 63 are respectively attached to part of the rear surface of the first substrate 51 and part of the bottom portion 91 of the case 90, the present invention is not limited thereto. Accordingly, the buffer member 170 may be attached to the entire rear surface of the first substrate 51 and the entire bottom portion 91 of the case 90.

In this manner, the buffering member 170 has an adhesion function as well as a buffering function, and therefore a configuration for fixing the display panel assembly 150 onto the case 90 may be omitted.

The buffer layer 61 is made of a material having relatively weaker strength compared with the display panel assembly 150. That is, the buffer layer 61 needs to have relatively weak strength so that the display panel assembly 150 may not be broken by an impact that may be applied to the buffer layer 61. The buffer layer 61 may be made of a rubber material or the like. For example, the buffer layer 61 may be made of sponge formed by foaming a rubber solution or urethane obtained by fabricating a rubber solution as a synthetic resin.

Preferably, the thickness of the buffer layer 61 is determined by taking into account the buffering function and the thinning of the product. Accordingly, the buffer layer 61 preferably has a thickness ranging from 0.1 mm to 1.2 mm range. The adhesive layers 62 and 63, disposed on opposite surfaces of the buffer layer 61, may have a thickness ranging from about 0.02 mm to 0.05 mm, for example.

Although not shown, the OLED display 500 may further include a cover window. The cover window may be coupled to the side wall portion 92 of the case 90 to cover the display panel assembly 150. At this point, the cover window is spaced apart from the display panel assembly 150.

With such a configuration, the OLED display 500 can effectively prevent damage of the display panel assembly 150 when it receives an external impact due to a drop or the like.

That is, the case 90 has a thickness t within the range of about 0.4 mm to about 1.5 mm and has proper strength to protect the display panel assembly 150. At this point, the case 90 preferably maintains flexural rigidity so as to not have excessive flexibility or rigidity.

Moreover, the side wall portion 92 of the case 90 is spaced apart from the sides of the display panel assembly 150. This can prevent deformation of the case 90 from being transferred as it is to the display panel assembly 150 and from colliding with the display panel assembly 150 and damaging the display panel assembly 150.

Further, the buffer member 170 absorbs an impact or distributes an impact concentrated on the local region, thereby effectively preventing damage of the display panel assembly 150.

Figure 25:
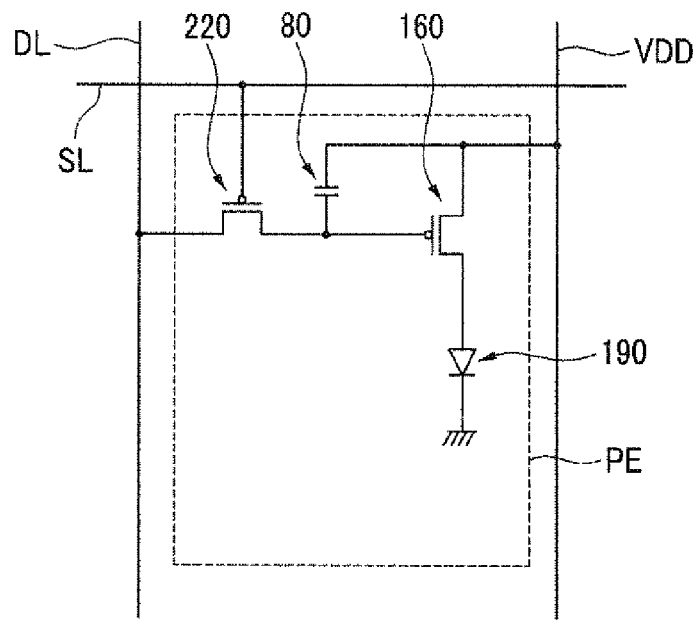
FIG. 25 is a layout view showing a pixel circuit of the display panel assembly of FIG. 22.
Figure 26:
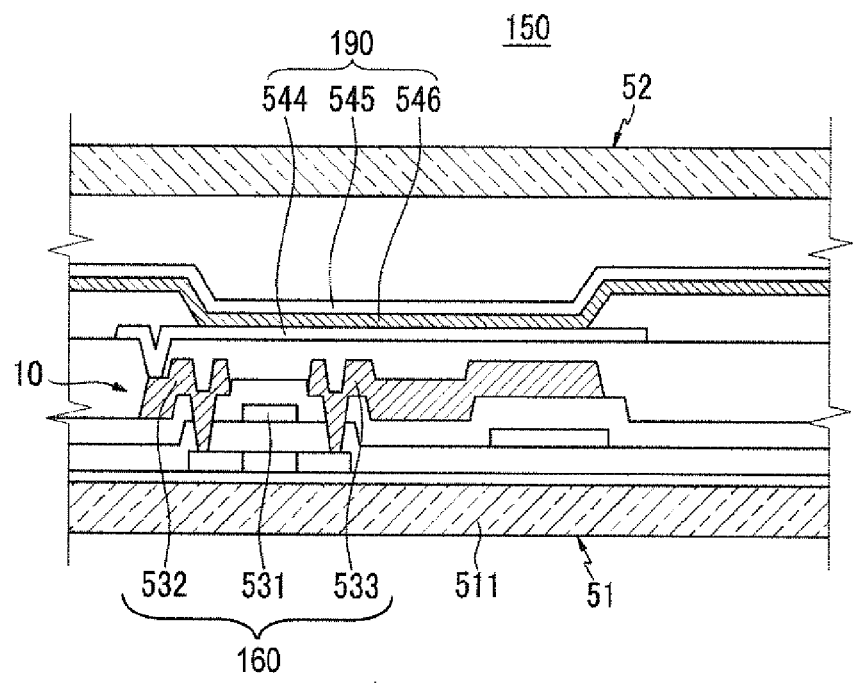
FIG. 26 is a partial enlarged cross-sectional view of the display panel assembly of FIG. 22.

The internal structure of the display panel assembly 150 will now be described with reference to FIGS. 25 and 26.

The display panel assembly 150 has a plurality of pixels to display images. As shown in FIG. 25 and FIG. 26, a pixel includes an organic light emitting element 190 and driving circuit units 160, 220, and 80. The pixel is generally formed on the first substrate 51. That is, the first substrate 51 includes a substrate member 511, the driving circuit units 160, 220, and 80 formed on the substrate member 511, and the organic light emitting element 190.

The organic light emitting element 190 includes an anode electrode 544, an organic light emission layer 546, and a cathode electrode 545. The driving circuit units include at least two thin film transistors 160 and 220 and at least one storage capacitor 80. The thin film transistors basically include a switching transistor 220 and a driving transistor 160.

The switching transistor 220 is connected with a scan line SL and a data line DL, and transfers a data voltage, which is input from the data line DL according to a switching voltage inputted to the scan line SL, to the driving transistor 160. The storage capacitor 80 is connected with the switching transistor 220 and a power source line VDD, and stores a voltage corresponding to the difference between the voltage received from the switching transistor 220 and a voltage supplied to the power source line VDD.

The driving transistor 160 is connected with the power source line VDD and the storage capacitor 80, and supplies an output current $I_{OLED}$ approximately proportional to the square of the difference between the voltage stored in the storage capacitor 80 and a threshold voltage to the organic light emitting element 190. The organic light emitting element 190 emits light according to the output current $I_{OLED}$. The driving transistor 160 includes a source electrode 533, a drain electrode 532, and a gate electrode 531. The anode electrode 544 of the organic light emitting element 190 is connected to the drain electrode 532 of the driving transistor 160. The structure of the pixel may be modified and is not limited to the above example.

The second substrate 52 covers the organic light emitting element 190 and the driving circuit units 160, 220, and 80.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. An organic light emitting diode display, comprising:
   a first substrate and a second substrate disposed facing the first substrate, the first substrate comprising a display area and a pad area;
   a buffer member disposed on one surface of the first substrate;
   a bezel for accommodating a display panel comprising the first substrate and the second substrate; and
   a case enclosing the bezel;

the buffer member comprising a first buffer member and a second buffer member, the first buffer member being disposed between the display panel and the bezel and the second buffer member being disposed between the bezel and the case; and each said buffer member comprising a buffer layer and an adhesive layer formed on at least one surface of the buffer layer.

2. The organic light emitting diode display of claim 1, the buffer layer comprising one of sponge and urethane.

3. The organic light emitting diode display of claim 1, the buffer layer having a thickness ranging from 0.1 mm to 0.3 mm, and the adhesive layer having a thickness ranging from 0.02 mm to 0.04 mm.

4. The organic light emitting diode display of claim 1, the display panel being fixed to the bezel by the first buffer member.

5. The organic light emitting diode display of claim 4, the adhesive layer being comprised of a first adhesive layer and a second adhesive layer respectively formed on opposite surfaces of the buffer layer, the first adhesive layer being attached to the display panel and the second adhesive layer being attached to the bezel.

6. The organic light emitting diode display of claim 4, one surface of the buffer member being in contact with and attached to an inner bottom portion of the bezel, the buffer member being attached to the entire one surface of the first substrate.

7. The organic light emitting diode display of claim 4, the buffer member being comprised of a bottom portion and a skirt portion protruding from an edge of the bottom portion, the skirt portion being bent perpendicular to the bottom portion so as to combine with and cover corresponding edges of the display panel, the combined display panel and buffer member being contained in the bezel so as to cover inside portions of the bezel.

8. The organic light emitting diode display of claim 4, the bezel being made of a metal.

9. The organic light emitting diode display of claim 1, the adhesive layer comprising a first adhesive layer and a second adhesive layer respectively formed on opposite surfaces of the buffer layer, the first adhesive layer being attached to the display panel and the second adhesive layer being attached to the case.

10. The organic light emitting diode display of claim 1, the buffer member being attached to a portion of an upper surface of the second substrate and being further attached to a bottom surface of the first substrate.

11. The organic light emitting diode display of claim 1, wherein the case is made of plastic.

12. The organic light emitting diode display of claim 1, the case having a thickness ranging from 0.4 mm to 1.5 mm.

13. The organic light emitting diode display of claim 12, the case comprising at least one of a resin-based material comprising polycarbonate (PC), and a metal-based material comprising stainless steel (SUS), magnesium (Mg), aluminum (Al), and their alloys.

14. The organic light emitting diode display of claim 12, the case comprising a bottom portion contacting the buffer member and a side wall portion protruding and extending from the bottom portion and enclosing at least part of sides of the display panel, the side wall portion being spaced apart a predetermined distance from the sides of the display panel.

15. The organic light emitting diode display of claim 14, the predetermined distance being greater than 0.5 mm.

* * * * *